United States Patent [19]
Togawa et al.

[11] Patent Number: 5,893,794
[45] Date of Patent: Apr. 13, 1999

[54] POLISHING APPARATUS HAVING ROBOTIC TRANSPORT APPARATUS

[75] Inventors: Tetsuji Togawa, Chigasaki; Kuniaki Yamaguchi; Kunihiko Sakurai, both of Yokohama, all of Japan

[73] Assignee: Ebara Corporation, Tokyo, Japan

[21] Appl. No.: 08/808,690

[22] Filed: Feb. 28, 1997

[30] Foreign Application Priority Data

| Feb. 28, 1996 | [JP] | Japan | 8-069260 |
| Oct. 15, 1996 | [JP] | Japan | 8-294543 |
| Jan. 22, 1997 | [JP] | Japan | 9-024357 |

[51] Int. Cl.$^6$ ............................... B24B 7/06
[52] U.S. Cl. .................. 451/67; 451/339; 451/914
[58] Field of Search .................. 451/41, 67, 285, 451/286, 287, 288, 289, 290, 339, 914; 901/1, 40, 49, 50

[56] References Cited

U.S. PATENT DOCUMENTS

| 3,841,028 | 10/1974 | Katzke . | |
| 4,002,246 | 1/1977 | Brandt et al. | 451/334 X |
| 5,174,067 | 12/1992 | Hasegawa et al. | 451/339 X |
| 5,653,624 | 8/1997 | Ishikawa et al. | 451/287 |
| 5,655,954 | 8/1997 | Oishi et al. | 451/287 X |
| 5,676,590 | 10/1997 | Hiraoka | 451/287 |
| 5,679,055 | 10/1997 | Green et al. | 451/287 |

FOREIGN PATENT DOCUMENTS

| 4-63643 | 5/1992 | Japan . |

*Primary Examiner*—Timothy V. Eley
*Attorney, Agent, or Firm*—Wenderoth, Lind & Ponack, L.L.P.

[57] ABSTRACT

A robotic transport apparatus is capable of providing an effective waterproofing function of working components without using mechanical seals. The robotic transport apparatus includes a robot body, an arm assembly extendably attached to the robot body, and a workpiece holding section attached to the arm assembly. A pan member for waterproofing of the robot body is provided above the robot body and has an area not smaller than the workpiece holding section.

34 Claims, 10 Drawing Sheets

POLISHING APPARATUS HAVING ROBOTIC TRANSPORT APPARATUS

BACKGROUND OF THE INVENTION

1. Field of the Invention

The present invention relates to a robotic transport apparatus suitable for transporting workpieces in a semiconductor device manufacturing system, for example, including wet and/or dirty processes such as a CMP (chemical mechanical polishing) system.

2. Description of the Related Art

In a semiconductor wafer manufacturing process, a polishing apparatus is commonly used to provide a flat mirror polished surface on wafers. Such a polishing apparatus comprises a turntable and a top ring independently rotated relative to each other, and a wafer held on the underside of the top ring is polished by pressing the wafer against a polishing surface provided at the top surface of the turntable while supplying an abrasive liquid onto the surface. The polishing apparatus also includes a wafer storage unit for placing a cassette including wafers to be polished, a cleaning unit for cleaning and drying the polished wafers, and a transport apparatus for transporting the wafers between the processing units.

Figure 11:
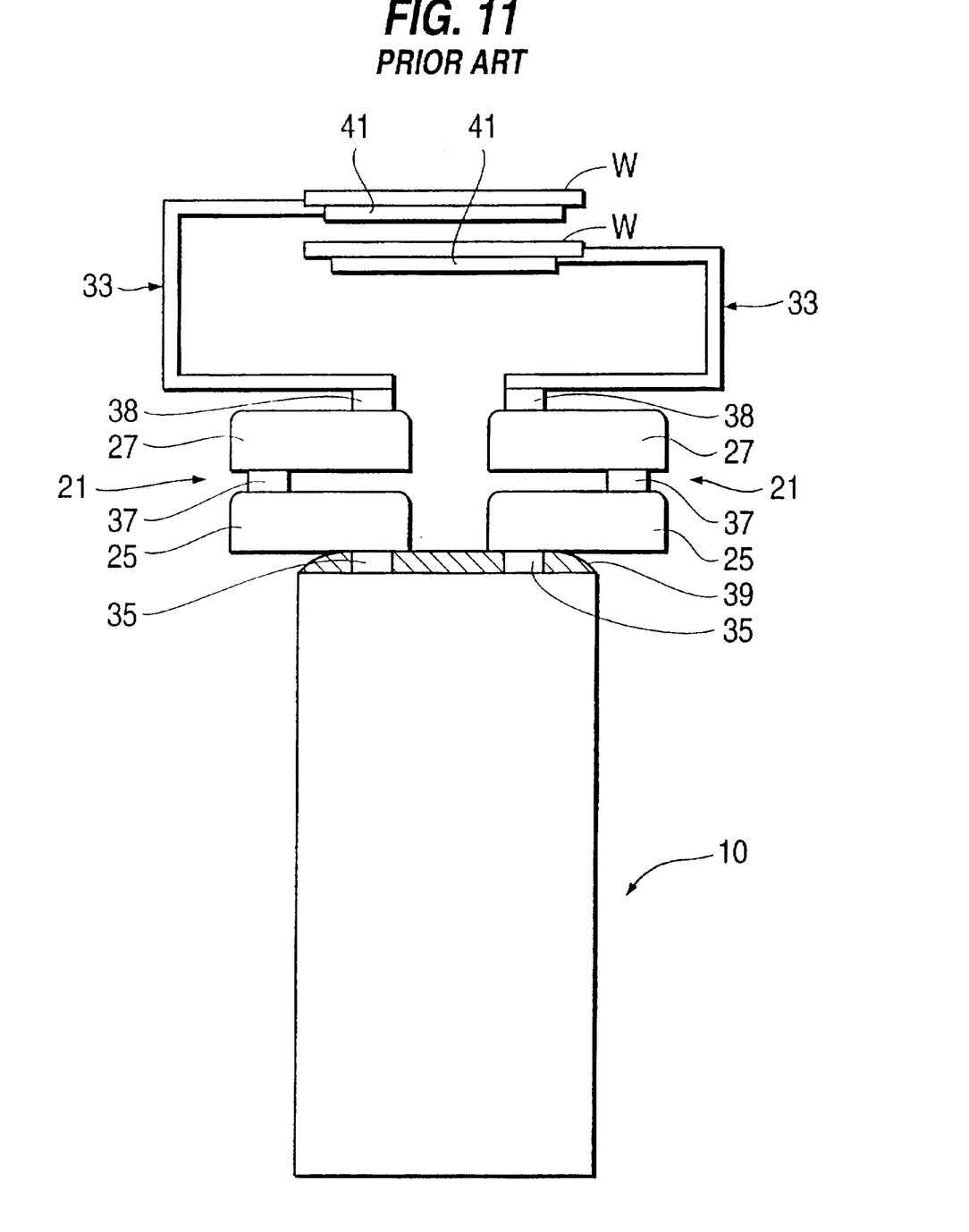
FIG. 11 is a schematic side view of a conventional robotic transport apparatus.

An example of such transport apparatus is shown in FIG. 11. The apparatus comprises a cylindrical robot body 10 and a set of arm devices 21 disposed on the top surface of the robot body 10. Each arm device 21 comprises two arms 25, 27 having articulating joint sections 35, 37, and the upper arm 27 is provided with a hand member (workpiece holding section) 41 disposed at the tip end of a connection member 33 through an articulating joint section 38.

Figure 12:
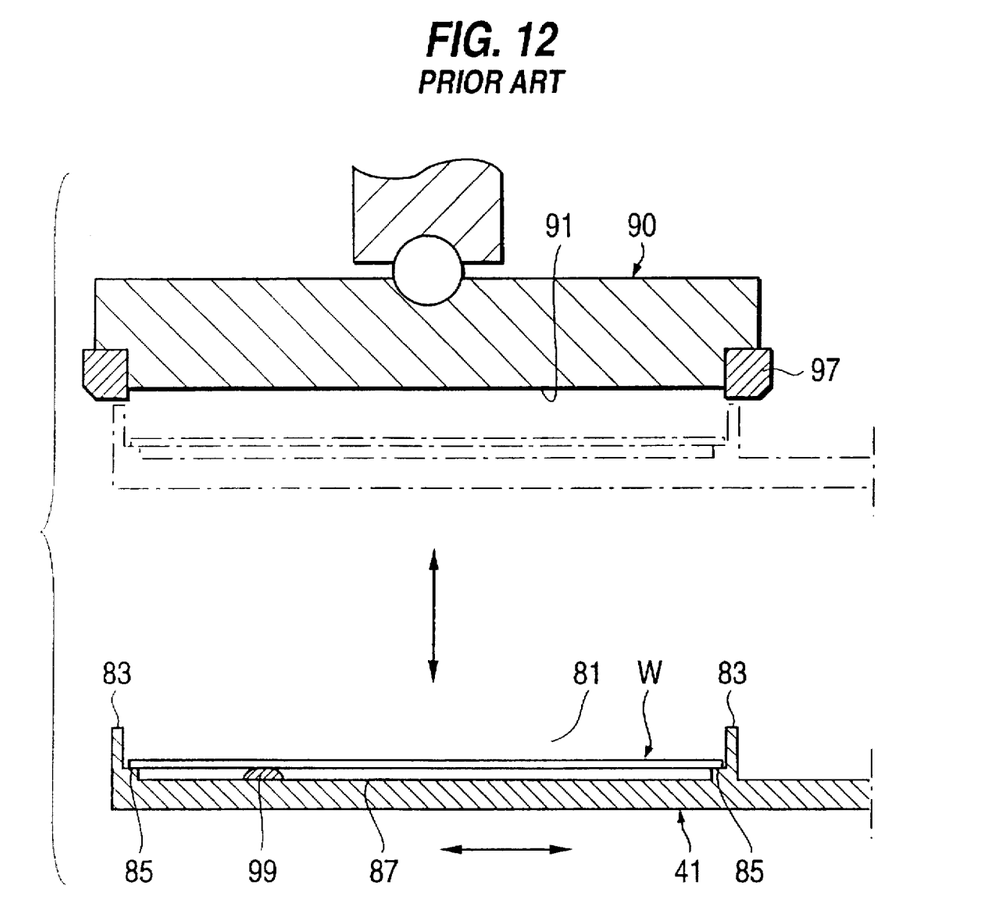
FIG. 12 is an illustration of the process of transfer of a wafer between a top ring and a hand member in the conventional robotic transport apparatus.

An example of the configuration of the hand member is shown in FIG. 12. The hand member 41 is substantially plate-shape and has a recess in its central region serving as a receiving section 81 which is surrounded with protruding guides 83. The receiving section 81 comprises a wafer contact surface 85 for abutting the lower surface edges of a wafer W, and a bottom section surface 87 which is disposed inwardly of the wafer contact surface 85 at a lower level than the wafer contact surface 85. On the other hand, a top ring 90 is of a circular shape, and is provided with a bottom vacuum suction surface 91 and a guide ring 97 attached to its periphery.

To transfer the wafer W from the top ring 90 to the hand member 41 of such an arrangement, the hand member 41 is placed directly below the top ring 90 holding the wafer W by vacuum suction, and then the vacuum hold on the wafer is released by shutting off the vacuum suction so that the wafer W will drop into the receiving section 81 of the hand member 41. This operation is illustrated by designating the hand member 41 with single dot lines in the top portion of FIG. 12. After dropping the 25 wafer W, the hand member 41 is moved away downwardly.

This type of robotic transport apparatus is used to transport the wafers W to various processing apparatuses for various processing steps, such as polishing and cleaning steps, by means of the connection member 33. The wafers are often dripping with processing liquid, and in transporting wet wafers liquid droplets falling from the wafers of ten accumulate on the top surface of the robot body 10.

When the quantity of liquid droplets increases to fill the gap surrounding the articulating joint section 35, as illustrated by shaded areas 39 in FIG. 11, the liquid can penetrate into the arm 25 and robot body 10 through crevices in the

2 joint section 35. Such seepage of liquid leads to corrosion of the mechanisms to generate malfunctioning of the working parts, leading to increased requirements for maintenance. Such operational problems lower the cost performance ratio of the apparatus and lead to loss of productivity. The same problems occur when the liquid seeps into joint sections 37, 38.

To prevent such seepage of liquid, a usual practice is to use mechanical seals, however, such contact seals have still some clearance and are not totally water tight, and it has been extremely difficult to prevent such liquid seepage into critical operating components of the apparatus. Furthermore, when O-rings, which are known to provide effective contact sealing, are used to seal joint section 35, 37 or 38, although the seepage clearance is reduced by the strong elastic sealing force of the O-rings, the local frictional forces are increased owing to the large frictional forces exerted by the compressed O-rings. The result is a drop in the operational speed of the arms 25, 27. On the other hand, if the speed of the arms 25, 27 is to be maintained, it is necessary to provide a larger torque for arm rotation, thus generating a problem of need for a driving motor with a larger driving capacity.

Also, the conventional design of the guide member 83 is such that the upper edge thereof is formed at right angles to the vertical, and if there is a misalignment between the top ring 90 and the hand member 41, the outer periphery of the wafer W can easily become lodged in the angular section of the guide member 83, thus preventing the wafer W from being safely deposited within the receiving section 81.

Another problem with the existing design of the robotic transport apparatus for handling the wafers is that the bottom section surface 87 of the hand member 41 often becomes contaminated with droplets 99 of liquid from sources such as abrasive liquid. Droplets 99 form spheres due to the surface tension on the bottom section surface 87 as illustrated in FIG. 12, and the diameter of such a sphere may exceed the separation distance between the wafer contact surface 85 and the bottom section surface 87 which commonly is only about 1.5 mm. Therefore, the droplet 99 could easily grow to contact the surface of the wafer W. It can be seen that if a hand member 41, having such large droplets 99 of abrasive liquid, is used to pickup a wafer W from a cleaning device, it can lead to a problem that the cleaned wafer has now become contaminated with the substances in the abrasive liquid.

SUMMARY OF THE INVENTION

It is therefore an object of the present invention to provide a robotic transport apparatus which can provide an effective waterproofing function for working components without using mechanical seals.

It is another object of the present invention to provide a robotic transport apparatus which can safely receive workpieces into a receiving section of a hand member to assure stable transportation of the workpieces, eliminate the possibility of contaminating the workpieces by liquid located at the hand member, and also lighten the weight of the hand member.

These objects are achieved by providing a robotic transport apparatus including a robot body, an arm assembly extendably attached to an upper surface of the robot body, a workplace holding section attached to the arm assembly, and a pan member for waterproofing having a projection area not smaller than the workplace holding section, provided between the workplace holding section and the robot body.

Accordingly, transfer of liquid from the workplaces to the robot body and seepage of liquid into joint sections of the arm assembly is prevented, to thus provide stable operation and a long service life of the system.

In another aspect of the transport apparatus, the arm assembly may be provided with a connection member connected to the workplace holding section in a manner to bypass the pan member. The pan member may be provided with a drainage pipe to remove waste liquid. The transport apparatus may be provided with a driving mechanism to enable the device to move along a transport path, and a trench may be provided alongside the transport path so that the waste liquid may be removed therethrough.

In another aspect of the invention, a transport apparatus includes a robot body, an arm assembly extendably attached to an upper surface of the robot body, and a workpiece holding section attached to the arm assembly, the workpiece holding section having a receiving section of recessed configuration for receiving a workpiece, and the receiving section including a contact surface for contacting lower peripheral surfaces of the workpiece and a bottom section surface disposed on an inner side of and at a lower level than the contact surface. A separation distance between the contact surface and the bottom section surface is selected to be not less than a maximum diameter of a droplet formed by a liquid that can be present at the bottom section surface. The separation distance should be greater than 3 mm.

DESCRIPTION OF THE PREFERRED EMBODIMENTS

In the following, preferred embodiments will be explained with reference to the drawings.

Figure 1:
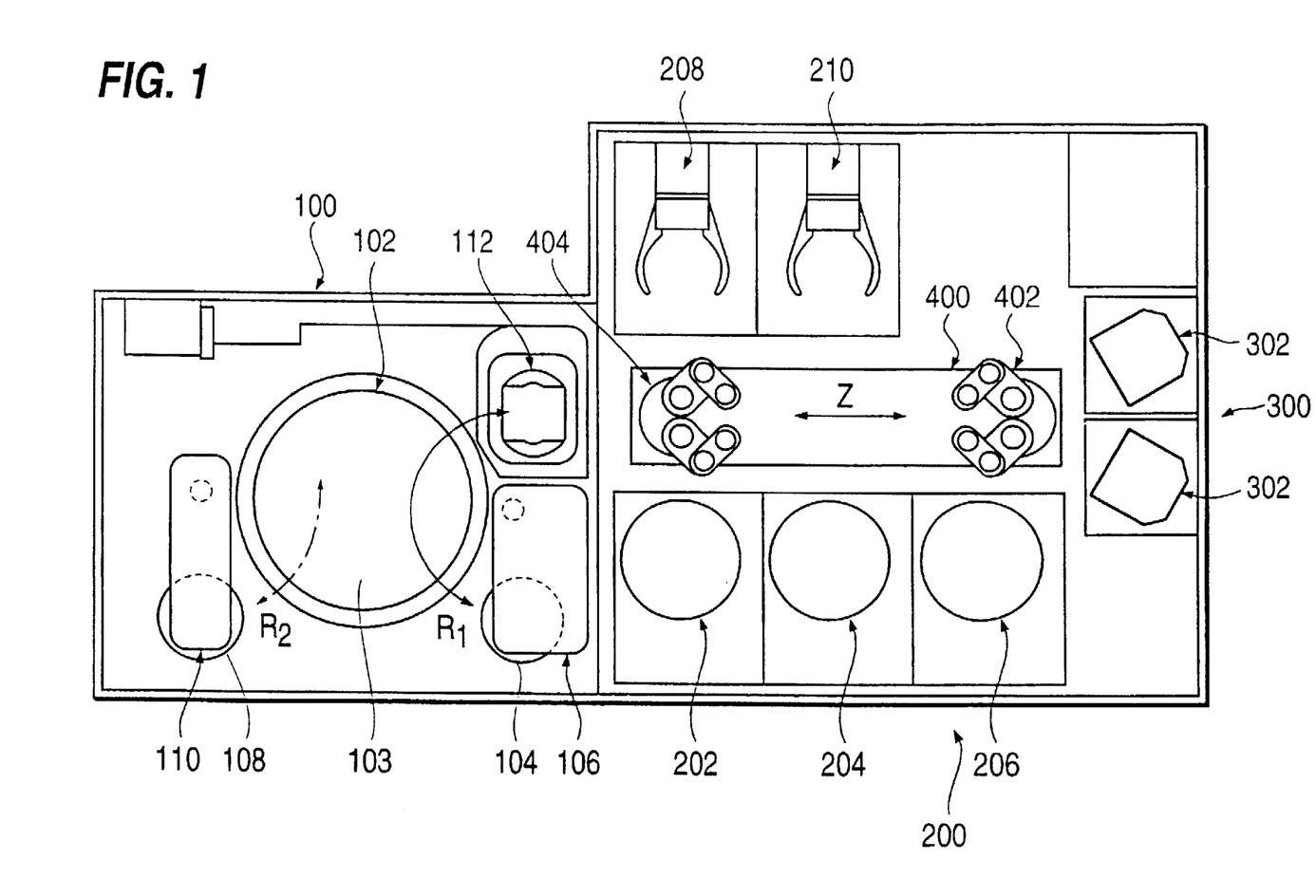
FIG. 1 is an overall plan view of an embodiment of a polishing apparatus of the present invention.
Figure 2:
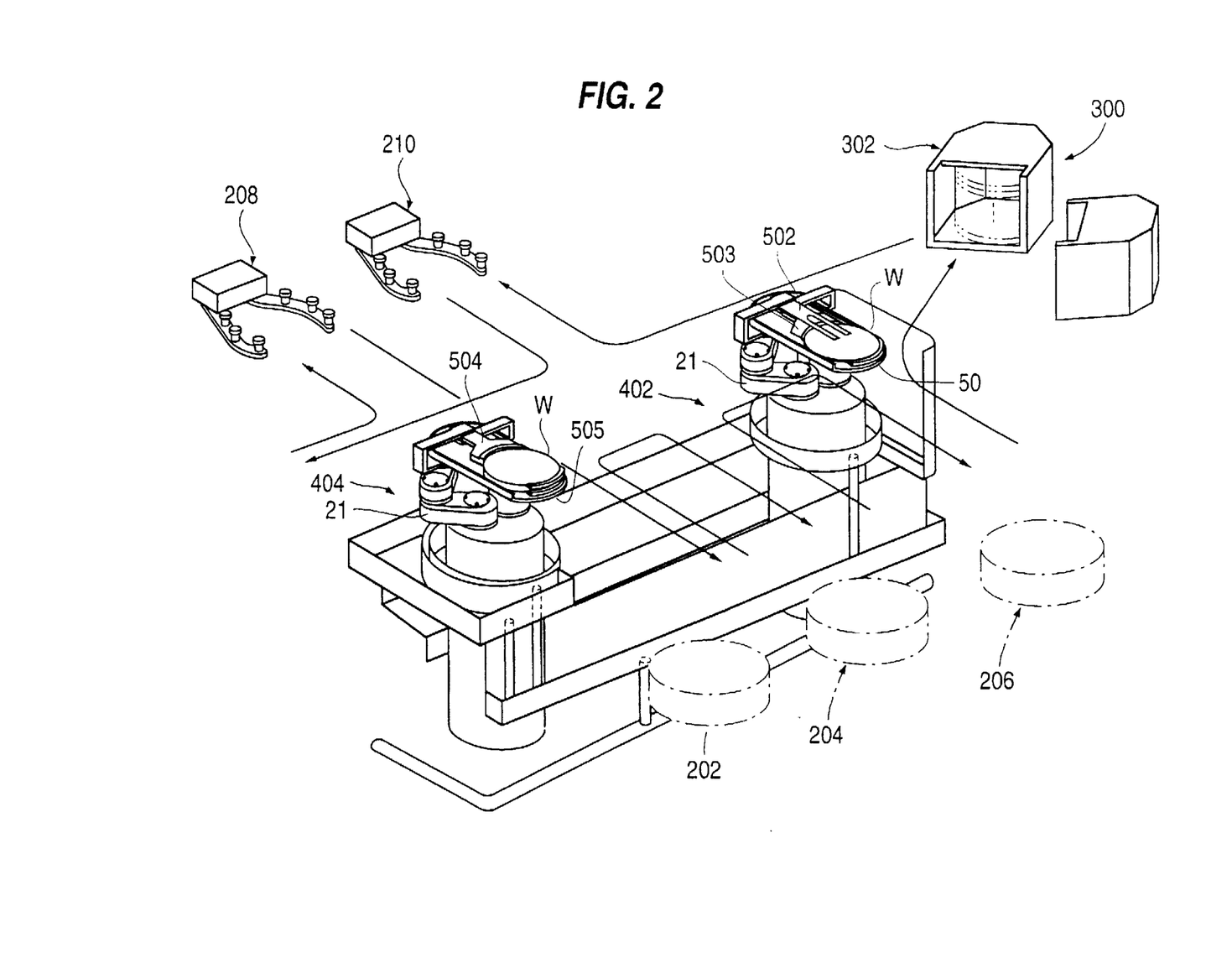
FIG. 2 is a perspective view of the flow of processed wafers being transported by a robotic transport apparatus of the present invention.

As shown in FIGS. 1 and 2, the polishing apparatus comprises a polishing section 100, a cleaning section 200, a storage section 300 for storing wafers W, and a transport apparatus 400 having two robotic transport apparatuses 402, 404 for transporting wafers W.

The polishing section 100 comprises a turntable 102 having a polishing surface 103, a polishing unit 106 having a top ring 104, a dressing unit 110 having a dressing tool 108, and a workpiece delivery device or handling unit 112.

The cleaning section 200 comprises primary and secondary cleaning devices 202, 204 and spin dryers (which may have washing capability) 206 disposed in a side-by-side arrangement on one side of the centrally disposed transport apparatus 400, and a wet workpiece turning device 208 and a dry workpiece turning device 210 disposed in a side-by-side arrangement on the other side of the transport apparatus 400.

FIG. 2 shows a perspective view of essential parts of the transport apparatus 400 and the cleaning section 200. As shown in the drawing, robotic transport apparatuses 402, 404 are each provided with two sets of arm assemblies 21. At the tip of each arm assembly 21 are provided respective hand members (workpiece holding sections) 502, 503 and 504, 505 for holding wafers W. The hand members 502, 503 and 504, 505 are arranged so that top hand member 502 superimposes bottom hand member 503 and likewise for the other set of top and bottom hand members 504, 505.

Figure 3:
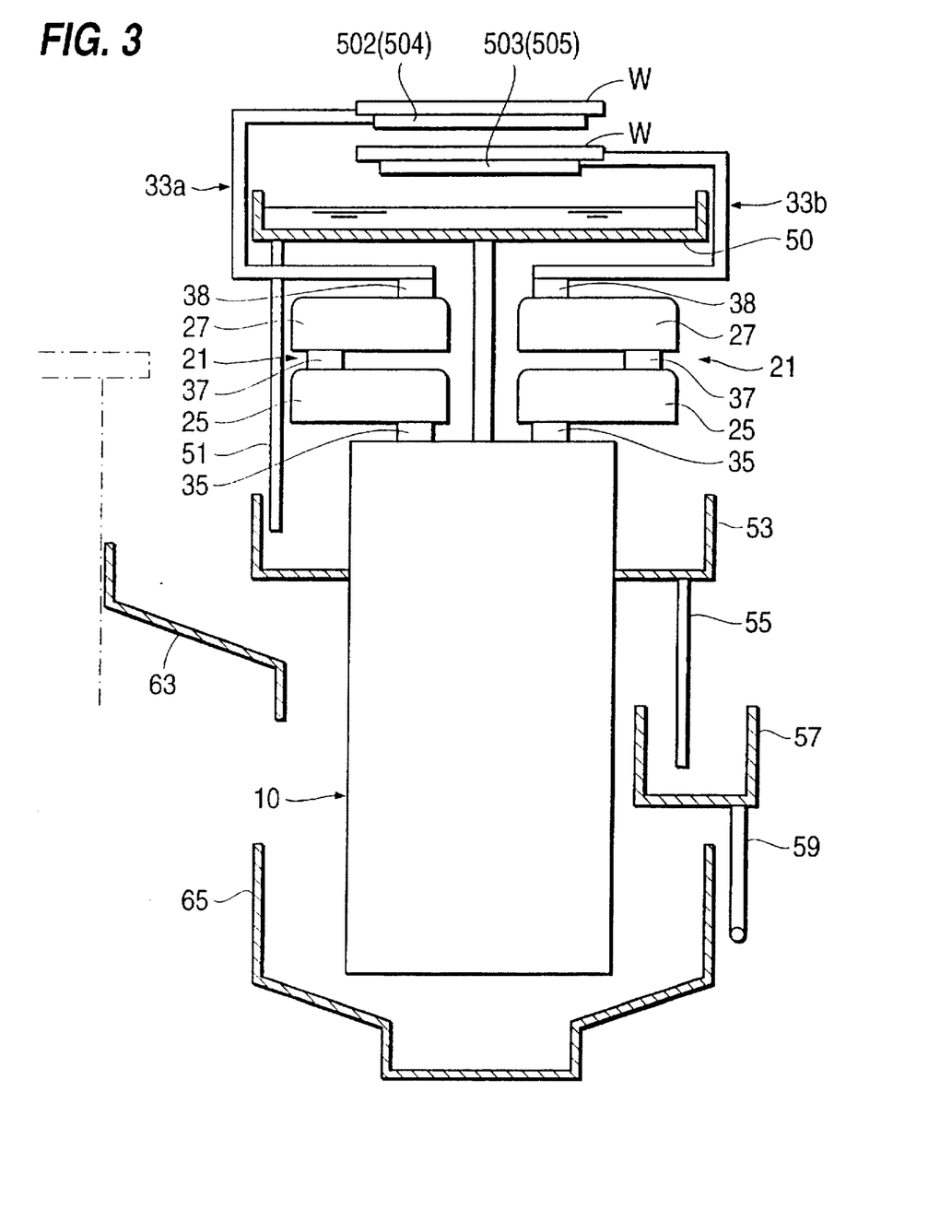
FIG. 3 is a cross-sectional view of the robotic transport apparatus of the present invention.

As shown in FIG. 3, a cross-sectional view of the robotic transport apparatuses 402, 404, each of the arm assemblies 21 comprises two arms 25, 27 respectively connected to robot body 10 and together by articulating joint sections 35, 37. Substantially U-shaped connection members 33a, 33b are joined to the arms 27 by articulating joint sections 38, and plate-shaped hand members 502 (504), 503 (505) for holding the wafers W are provided at tips of respective of the connection members 33a, 33b. Therefore, the hand members 502 (504), 503 (505) are connected to the arms 27 in a manner to bypass or be positioned outwardly of a waterproof pan member 50 which will be described hereinafter. That is, each of the hand members 502 (504), 503 (505) is generally aligned vertically above the tip of the respective arm 27 and the respective articulating joint section 38. The hand members 503 (505), 502 (504) are provided at the tips of the respective connection members 33a, 33b so that they superimpose vertically without touching each other. Each of the hand members 503 (505), 502 (504) is capable of holding on an upper surface thereof a wafer W.

Figure 4:
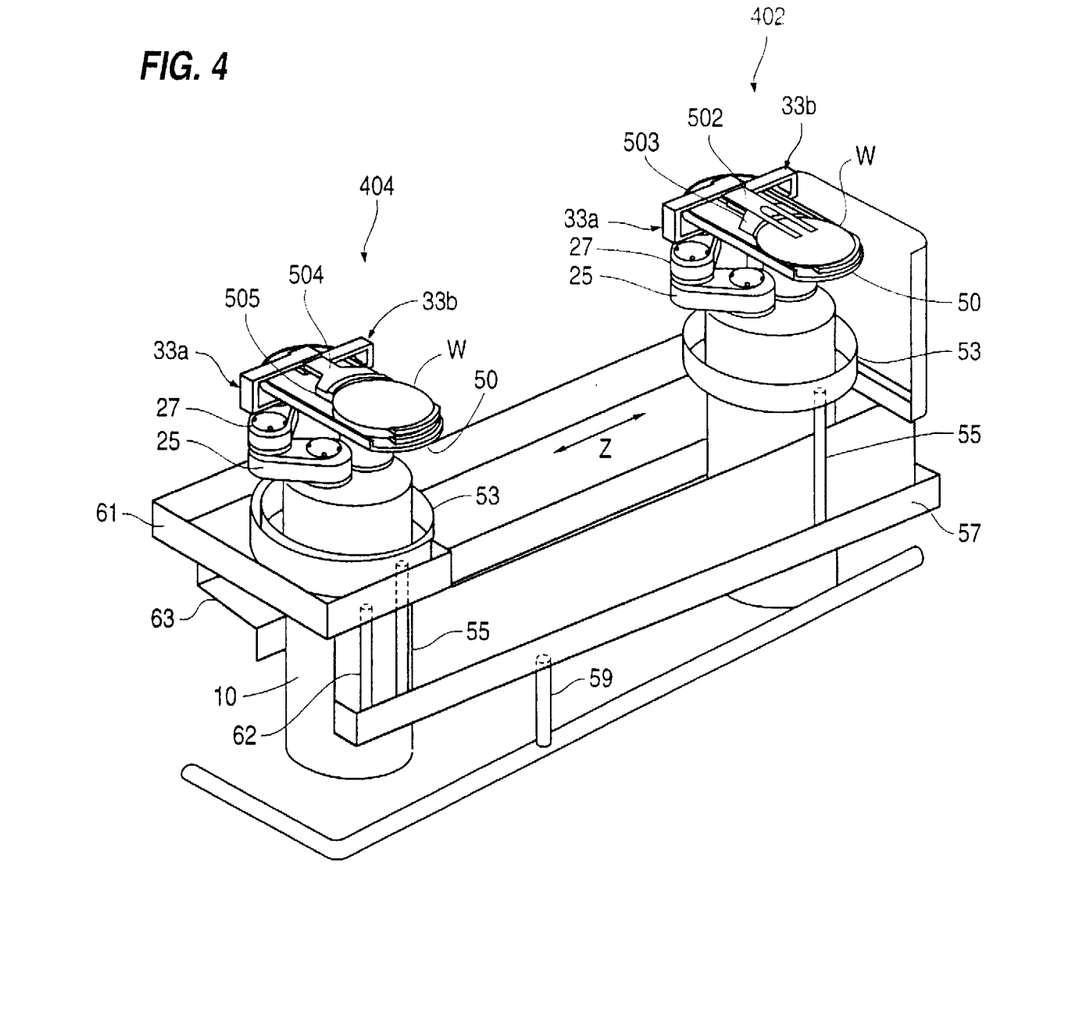
FIG. 4 is a perspective view of the robotic transport apparatus of the present invention.

In this embodiment, the connection member 33b is disposed below the connection member 33a, and waterproof pan member 50 or liquid reservoir is provided between the articulating joint sections 38 and the hand member 503 (505) attached to the lower connection member 33b. The size of the waterproof pan member 50 is chosen so that length and width dimensions thereof are larger than the diameter of the wafer W which is being held in the connection members 33a, 33b. Thus, a projection in a horizontal plane of the waterproof pan member 50 covers that of the hand member 503 (505). In this embodiment in particular, the length and width dimensions of the pan member 50 are larger than the diameter of robot body 10, and are larger than the hand members which serve as the workpiece holding sections. Also, the waterproof pan member 50 extends orthogonally at right angles to transport direction Z (FIG. 4). In other words, the waterproof pan member 50 is disposed so as to guard the entire area of movement of wafers W above the robot body 10.

As shown in FIGS. 3 and 4, a drainage pipe 51 is connected to a certain location of the waterproof pan member 50, and the bottom end of the drainage pipe 51 is inserted into a second waterproof pan member 53 of a ring shape arranged about the outer periphery of the robot body 10. The pan member 50 should be disposed at an incline to tilt towards the location of attachment of the drainage pipe 51 so as to facilitate draining. The second pan member 53 is also provided with a drainage pipe 55 whose bottom end is inserted into a trench 57. The robotic transport apparatuses 402, 404 are constructed so that they can move towards various processing locations, such as the polishing section 100 and the cleaning section 200, by proceeding in the direction Z shown in FIG. 4. The trench 57 is formed, as shown in FIG. 4, along one side of the two robotic transport apparatuses 402, 404 over the entire length of movement thereof. The trench 57 is also provided with a drainage pipe 59. A third waterproof pan member 61 is provided on the left side of the robotic transport apparatus (as viewed in FIG. 4 and omitted in FIG. 3), and a drainage pipe 62 provided on the third pan member 61 is inserted into the trench 57. Opposite to the trench 57, a fourth waterproof pan member 63 is provided over the entire length of movement of the robotic transport apparatus. A fifth waterproof pan member 65 is provided below the robot body 10, as shown in FIG. 3 and omitted in FIG. 4.

Figure 5:
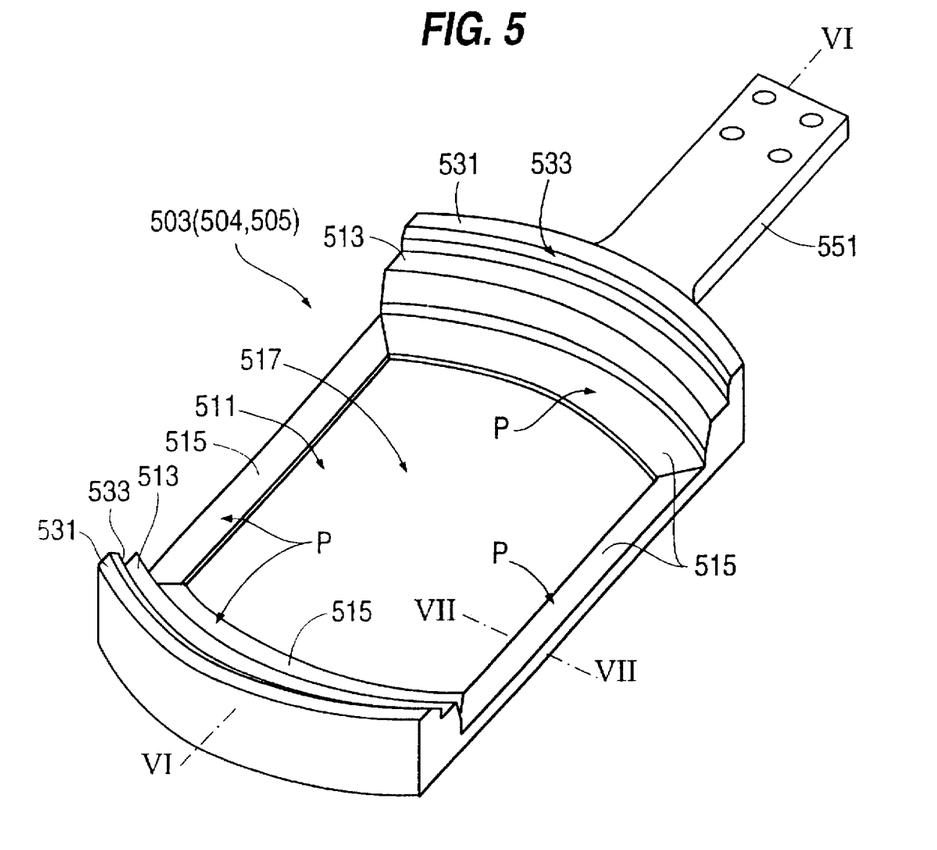
FIG. 5 is a perspective view of a hand member.

The hand member 502 has a vacuum suction mechanism to hold wafers W thereon and is used to handle only dry wafers W, while all the other hand members 503, 504 and 505 (all represented by 503 hereinbelow) are for handling wet wafers W wetted by liquids such as polishing, rinsing or cleaning liquids. The wet workpiece hand members 503 have a shelf shaped tray for receiving the workpiece at the periphery thereof. As shown in FIG. 5, the hand member 503 is constructed to include a receiving section 511 of a depressed shape for storing circular shaped wafers W and formed in the center region of the hand member 503, outer guide portions 531 on opposite sides of the receiving section 511, and a handle portion 551 protruding from one outer guide position 531.

The receiving section 511 includes two arc shaped contact surfaces 513 for abutting the outer periphery of the wafer W, bottom section surfaces 515 at a lower level than the contact surfaces 513 and disposed between the two contact surfaces 513, and a drainage opening 517 disposed centrally between bottom section surfaces 515. All regions of the bottom section surfaces 515 are inclined to slope towards the drainage opening 517 to serve as tapered drainage surfaces P for liquid drainage. A height difference T1 (FIG. 6) between the contact surfaces 513 and the highest position of the bottom section surfaces 515 is larger than the maximum dimension of a liquid droplet grown by surface tension effects and located on a bottom section surface 515. In this embodiment, the height dimension T1 is chosen to be larger than 6 mm. On the other hand, the upper inside edge of each guide portion 531 has a tapered guide surface 533 inclined outwardly and upwardly. The taper angle [symbol] of the guide surface 533 should not be too large for the wafer W to slide down along the guide surface 533, so a preferred angle is about 20 degrees.

To prevent corrosion on the hand member 503 or metallic contamination of the wafer W, the hand member 503 made of a metal plate (for example, aluminum or SUS plate) coated with a polymeric coating material. Instead of a polymeric coating, it is also permissible to attach polymer parts prepared separately to the hand member 503 for constructing the regions of direct contact with wafer W, i.e., the inside surfaces including the guide surfaces 533 of the guide portions 531 and the contact surfaces 513. The handle portion 551 is attached to the tip of the respective connection member 33a, 33b.

The overall operation of the polishing apparatus will be explained with reference to FIGS. 1 and 2. The hand members 502 to 505 of the robotic transport apparatuses 402, 404 are independently extendable in horizontal and vertical directions. When cassette 302 containing pre-polishing wafers W is placed in the location shown in the drawings, the hand member 502 of the robotic transport apparatus 402 removes one wafer W at a time from the cassette 302 and transfers it to the workpiece turning device 210 which turns over the wafer W. From the turning device 210, the wafer W is passed onto the hand member 504 of the transport apparatus 404, and is transported to the workpiece delivery device 112 of the polishing section 100. The wafer W on the workpiece delivery device 112 is transferred onto the bottom surface of the top ring 104 of the polishing unit 106 (which swings in the direction of the arrow $R_1$, shown in FIG. 1) and is positioned on the turntable 102, and is polished by the rotating polishing surface 103. The polishing surface 103 is supplied with an abrasive liquid through a supply pipe (not shown) during the polishing operation. The polished wafer w is again returned to the workplace delivery device 112, and is transferred to the workplace turning device 208 by the hand member 505 of the robotic transport apparatus 404 and is turned over while being rinsed with a rinsing liquid. The wafer W is then transported to the primary cleaning device 202 by the hand member 505 to be cleaned, then onto the secondary cleaning device 204 by the hand member 504 to be cleaned, and is transported to the spin dryer 206 by the hand member 503 to be dried therein, and is returned to the original cassette 302 by the hand member 502. The dressing unit 110 shown in FIG. 1 is used to dress the polishing surface 103 by moving onto the turntable in the direction of arrow $R_2$ and by pressing the dressing tool 108 onto the rotating polishing surface 103.

In this arrangement of the polishing apparatus, the hand member 502 is fork-shaped and is used only to handle dried wafers W, and all other wafers W wet with polishing, rinsing or cleaning liquid are handled by the hand members 503–505, each of which has a drip tray. This arrangement prevents the wafers W from being contaminated through the use of the hand members 502–505.

In the above steps, when the wafers W are handled by the hand members 503–505 in the polishing section 100 or in the cleaning section 200, the liquid from the wet wafers W will drip down, but the robot body 10 is completely protected from becoming wet by the first waterproof pan member 50, thus preventing droplets from falling onto the upper surfaces of the robot body 10 and the arms 25, 27. Therefore, there is no danger of liquid seeping from the articulating joint sections 35, 37 and 38 into the arms 25, 27 or into the robot body 10. The liquid droplets falling onto the pan member 50 are 25 collected in the trench 57 after passing through the drainage pipe 51, the second waterproof pan member 53, and the drainage pipe 55 and are discarded externally through the drainage pipe 59. The second pan member 53 not only performs the function of guiding the liquid droplets falling on the pan member 50 to the trench 57, but also performs the function of collecting the droplets even when the droplets which should have fallen into the pan member 50 are accidentally scattered about the robot body 10 by some event such as vibration, for example. When handling the wafers W in the polishing section 100 or in the cleaning section 200, the wafers W extend outwardly of the pan member 50, but the droplets which fall from the wafers W are collected in the third and fourth pan members 61, 63 and in the trench 57, and are drained through the drainage pipe 59 and the fifth pan member 65 (FIG. 3).

It will be apparent from the above that the first and second pan members 50 and 53 primarily serve the purpose of preventing droplets from falling onto the workpiece transport apparatuses, and the third, fourth and fifth pan members 61, 63 and 65 primarily serve the purpose of preventing the droplets from falling onto facilities and devices while the wafers W are being handled between the wafer transport apparatuses and wafer processing devices. Water removal means such as trench 57 are used commonly for both purposes. Each pan or trench may be formed to have a tapered cross section widening towards an upper opening to facilitate fluid inflow.

Figure 6:
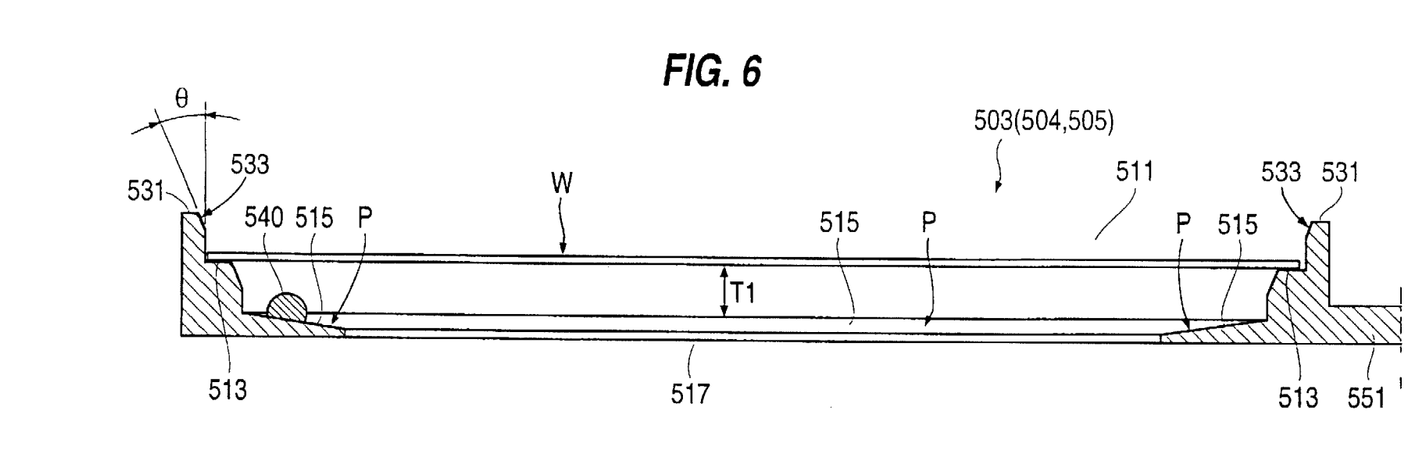
FIG. 6 is a cross-sectional view of the hand member taken along a plane VI—VI in FIG. 5.

Next, the role of the hand members 503–505 will be explained further. When the wafer W held by the top ring 90 shown in FIG. 12, for example, is to be dropped into the hand member 505, the hand member 505 is brought directly below and adjacent to the top ring 90 holding the wafer W. The vacuum on the top ring 90 is then released so that the wafer W may be dropped into the receiving section 511 of the hand member 505. When the wafer W is dropped, even if the top ring 90 and the hand member 505 happen to be misaligned, the wafer W can slide down safely into the receiving section 511, by having the outer periphery of the wafer W guided by the guide surfaces 533 provided on the guide portions 531, without a danger of the wafer W being stuck at the upper edge of the guide portions 531. It can be understood that the droplets from the abrasive liquid and water used in polishing the wafer W adhere to the top ring 90, and they may easily fall onto the hand member 505 and collect on its upper surface. However, as illustrated in FIG. 6, the hand member 505 is designed so that even when the largest droplet 540 is formed, the clearance provided by the separation distance T1 between the bottom section surfaces 515 and the contact surfaces 513 is greater than the height dimension of the droplet 540, and there is no danger of the droplet 540 touching the bottom region of a wafer W. It should further be noted that because the bottom section surfaces 515 serve as tapered drainage surfaces P for liquid removal, the droplets 540 attached to the bottom section surfaces 515 slide along the tapered surfaces P and are removed by falling through the drainage opening 517. Furthermore, because of the presence of the drainage opening 517, the area of the bottom section surfaces 515 for receiving the droplets falling from the top ring 90 and wafers W becomes small, and little liquid will remain on the bottom section surfaces 515. Even if the droplets 540 should grow to a large size, there is no danger of the wafer W touching the droplets 540, thus totally preventing contamination of the wafer W by potentially harmful liquid. Further, since the hand member 505 is provided with the drainage opening 517, the weight of the hand member is reduced. The droplets dripping from the opening 517 or from around the periphery of the hand member 505 run into the waterproof pans 50, 53.

It is clear that the beneficial effects of the design and arrangement of the hand members in transferring the wafers W from the top ring apply equally in the case of transferring the wafers W or handling wafers W in other devices, such as the wafer turning devices and spin dryers.

Figure 7:
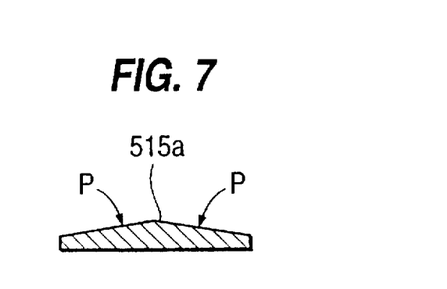
FIG. 7 is a cross-sectional view of a bottom section of another embodiment of the hand member of the present invention that would be similar to that taken along plane VII—VII in FIG. 5.

FIG. 7 is a cross-sectional view of another embodiment of the hand member, which corresponds to a view that would be through plane VII—VII shown in FIG. 5. As shown in FIG. 7, bottom section surface 515a comprises a central high region and tapered drainage surfaces P for removing liquid. This configuration provides the same advantages as those described in the previous embodiment. It is obvious that the shape of the receiving section, tapered drainage surface P and openings presented in the previous embodiment are only illustrative examples, and they can be designed in many different ways to achieve the same purpose.

Figure 8:
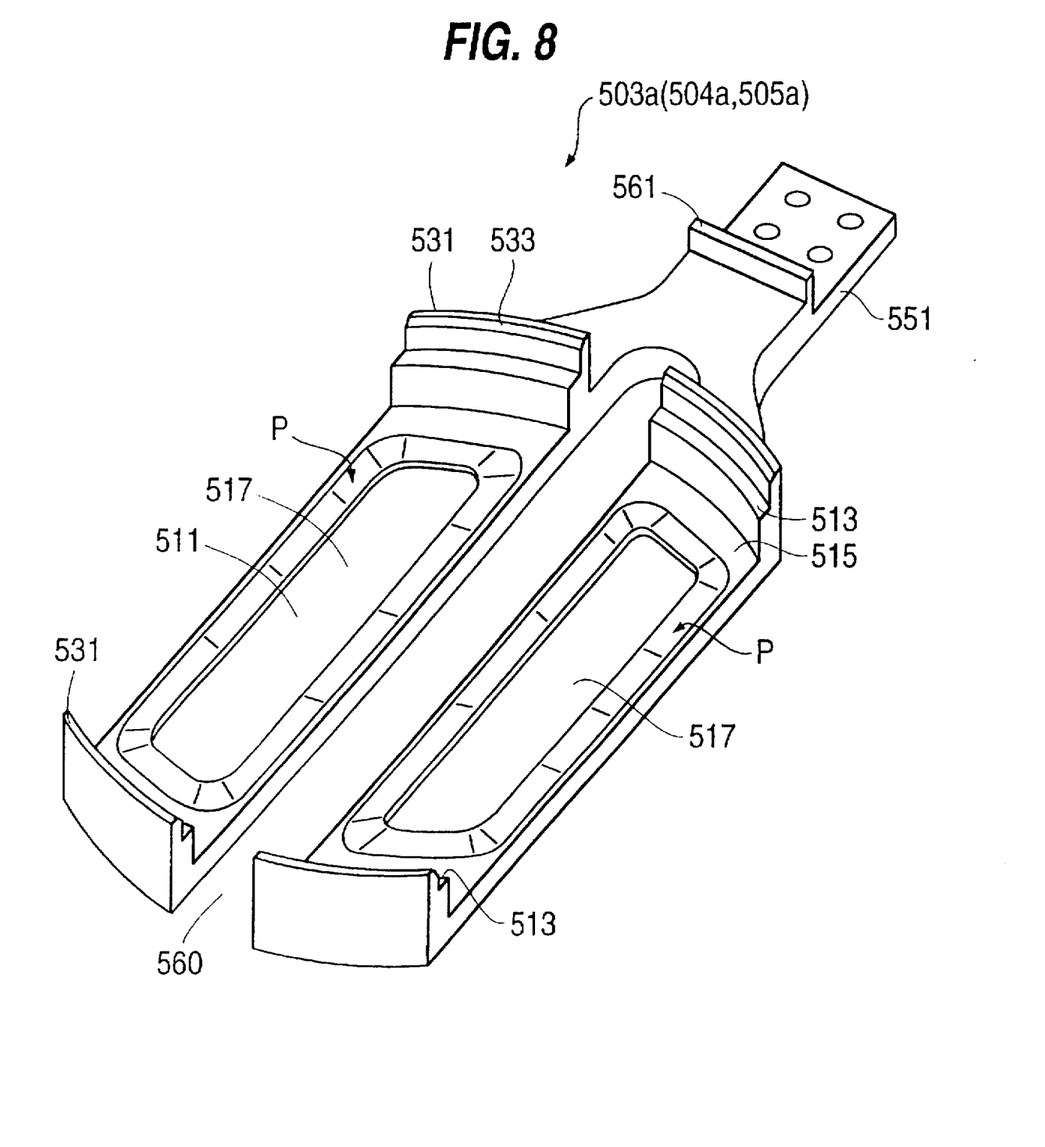
FIG. 8 is a perspective view of another embodiment of the hand member.
Figure 9:
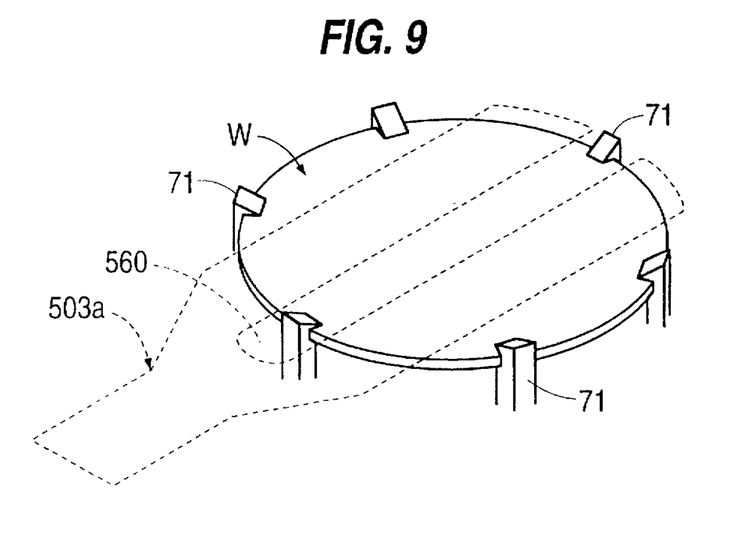
FIG. 9 is a schematic perspective view of the chuck mechanism and the hand member.
Figure 10:
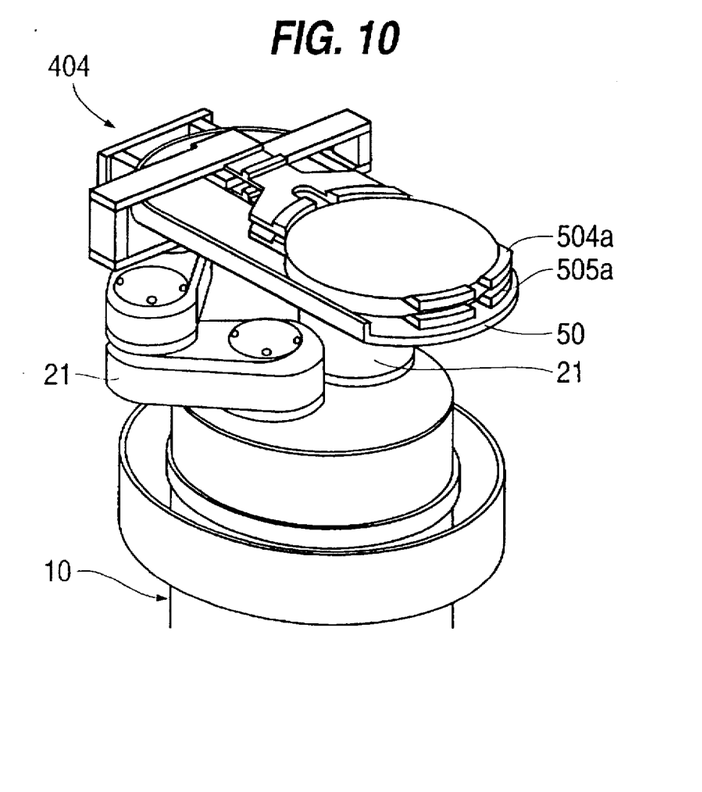
FIG. 10 is a perspective view showing the robotic transport apparatus having a hand member and a waterproof pan member.

FIGS. 8 to 10 are perspective views of another embodiment of a hand member 503a of the present invention. The parts of this hand member 503a which are the same as or similar to those of the hand member 503 shown in FIG. 5 are given the same reference numerals, and their detailed explanations will be omitted. The differences between the hand members shown in FIG. 5 and FIG. 8 are that the receiving section 511 of the hand member 503a has a longitudinal cut-out 560, and a protrusion section 561 is formed on the upper surface of the handle portion 551. The presence of the cut-out 560 causes the drainage opening 517 to be split into two sections, and each of the openings 517 is provided with a tapered drainage surface P.

With the hand member of FIG. 8, in addition to the benefits associated with the hand member shown in FIG. 5, the following advantages are obtained. The cut-out 560 reduces the area of the contact surfaces 513, thereby reducing the area of contact of the surfaces 513 with the wafer W, thereby further reducing the sites of potential contamination sources such as dust particles. Another advantage is that the presence of the cut-out 560 facilitates transferring of the wafer W to and from a wafer rotation device having a clamp mechanism for holding the wafer W. For example, the secondary cleaning device 204 and the spin dryer 206 shown in FIG. 1 require the wafer W to be held and rotated in a clamp such shown in FIG. 9. Such an operation can be performed by clamping the outer periphery of the wafer W with concentric hooks 71 shown in FIG. 9 so that the wafer W may be rotated. This configuration of the hand member 503a enables it to be placed under the clamped wafer W by locating a hook or hooks 71 within the cut-out 560 of the hand member 503a while the wafer W is being clamped by the set of hooks 71.

The protrusion section 561 on the handle portion 551 serves as a splash guard to prevent liquid droplets splashing from a wafer W from reaching the robot body while the hand member 503a is handling the wafer W. In this embodiment, because of the presence of the pan member 50 provided below the hand member 503a attached to the arm assembly 21 of the transport apparatus 402, there is no danger of the robot body becoming wet even if droplets fall from the hand member 503a.

It should also be noted that although a plurality of hand members 502–505 are provided on each of the two transport apparatuses 402, 404, the number of hand members is chosen for each application, and only one hand member may be sufficient in some cases. It will be equally clear that the number, attachment position and shape of the waterproof pan members are not limited by the examples shown in the illustrated embodiments. Although the waterproof pans are fixed relative to the robot body in the illustrated embodiments, one or more of the pans may be constructed movable to correspond with movement of a member. Flexibility is permitted within the scope of the invention to achieve splash protection for the robot body and articulating joints and other critical components of the robotic transport apparatus.

It should be noted also that although the operation of the hand member is disclosed herein in association with a polishing application, it is obvious that the transport apparatus of the present invention can be generally employed equally to other semiconductor processing applications, including photolithography, other types of cleaning facilities and sputtering equipment.

What is claimed is:

1. A robotic transport apparatus for transporting workpieces between processing sites, said apparatus comprising:

a robot body;

a workpiece holding section connected to said robot body; and a pan member positioned above said robot body, said pan member having an area at least as large as an area of said workpiece holding section.

2. An apparatus as claimed in claim 1, further comprising an arm assembly extendably attached to said robot body, and wherein said workpiece holding section is attached to said arm assembly.

3. An apparatus as claimed in claim 2, wherein said arm assembly includes a connection member connected to said workpiece holding section and bypassing said pan member.

4. An apparatus as claimed in claim 2, wherein said area of said pan member is greater than an area of an upper surface of said robot body.

5. An apparatus as claimed in claim 2, further comprising a joint section connecting said arm assembly to said robot body, and wherein said pan member is positioned vertically above and covers said joint section.

6. An apparatus as claimed in claim 5, wherein said arm assembly includes two arms connected by a further joint section, and wherein said pan member is positioned vertically above and covers said further joint section.

7. An apparatus as claimed in claim 5, wherein said workpiece holding section is connected to said arm assembly by a further joint section.

8. An apparatus as claimed in claim 2, comprising two arm assemblies attached to said robot body.

9. An apparatus as claimed in claim 2, wherein said pan member has extending therefrom a drain pipe.

10. An apparatus as claimed in claim 9, wherein said pan member is supported above an upper surface of said robot body, and further comprising a second pan member positioned about a periphery of said robot body, said drain pipe extending into said second pan member.

11. An apparatus as claimed in claim 9, wherein said pan member includes a drainage surface inclined downwardly toward said drain pipe.

12. An apparatus as claimed in claim 2, wherein said robot body is movable along a transport path.

13. An apparatus as claimed in claim 12, wherein said pan member is elongated in a direction orthogonal to said transport path.

14. An apparatus as claimed in claim 12, further comprising a drainage trench extending along said transport path, said drainage trench having extending therefrom a drain pipe.

15. An apparatus as claimed in claim 1, wherein said pan member comprises a liquid reservoir.

16. A polishing apparatus comprising: a polishing section for polishing workpieces; a cleaning section for cleaning the polished workpieces; a storage section for storing the workpieces; and a robotic transport apparatus for transporting workpieces between at least two of said polishing section, said cleaning section and said storage section, said robotic transport apparatus comprising:

a robot body;

a workpiece holding section connected to said robot body; and a pan member positioned above said robot body, said pan member having an area at least as large as an area of said workpiece holding section.

17. An apparatus as claimed in claim 16, further comprising an arm assembly extendably attached to said robot body, and wherein said workpiece holding section is attached to said arm assembly.

18. An apparatus as claimed in claim 17, wherein said arm assembly includes a connection member connected to said workpiece holding section and bypassing said pan member.

19. An apparatus as claimed in claim 17, wherein said area of said pan member is greater than an area of an upper surface of said robot body.

20. An apparatus as claimed in claim 17, further comprising a joint section connecting said arm assembly to said robot body, and wherein said pan member is positioned vertically above and covers said joint section.

21. An apparatus as claimed in claim 20, wherein said arm assembly includes two arms connected by a further joint section, and wherein said pan member is positioned vertically above and covers said further joint section.

22. An apparatus as claimed in claim 20, wherein said workpiece holding section is connected to said arm assembly by a further joint section.

23. An apparatus as claimed in claim 17, comprising two arm assemblies attached to said robot body.

24. An apparatus as claimed in claim 17, wherein said pan member has extending therefrom a drain pipe.

25. An apparatus as claimed in claim 24, wherein said pan member is supported above an upper surface of said robot body, and further comprising a second pan member positioned about a periphery of said robot body, said drain pipe extending into said second pan member.

26. An apparatus as claimed in claim 24, wherein said pan member includes a drainage surface inclined downwardly toward said drain pipe.

27. An apparatus as claimed in claim 17, wherein said robot body is movable along a transport path.

28. An apparatus as claimed in claim 27, wherein said pan member is elongated in a direction orthogonal to said transport path.

29. An apparatus as claimed in claim 27, further comprising a drainage trench extending along said transport path, said drainage trench having extending therefrom a drain pipe.

30. An apparatus as claimed in claim 29, further comprising a second pan member positioned about a periphery of said robot body and having a drain pipe extending into said drainage trench.

31. An apparatus as claimed in claim 30, further comprising a third pan member extending orthogonal to said transport path and having a drain pipe extending into said drainage trench.

32. An apparatus as claimed in claim 31, further comprising a fourth pan member extending along said transport path on a side thereof opposite said drainage trench.

33. An apparatus as claimed in claim 32, further comprising a fifth pan member beneath said robot body and extending along said transport path.

34. An apparatus as claimed in claim 16, wherein said pan member comprises a liquid reservoir.

* * * * *